(12) United States Patent
Fujimoto

(10) Patent No.: US 7,514,314 B2
(45) Date of Patent: Apr. 7, 2009

(54) METHOD OF MANUFACTURING SEMICONDUCTOR DEVICE AND SEMICONDUCTOR MEMORY DEVICE

(75) Inventor: Shun Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 107 days.

(21) Appl. No.: 11/657,570

(22) Filed: Jan. 25, 2007

(65) Prior Publication Data

US 2007/0190763 A1 Aug. 16, 2007

(30) Foreign Application Priority Data

Feb. 14, 2006 (JP) ............................. 2006-036034

(51) Int. Cl.
*H01L 21/8238* (2006.01)
(52) U.S. Cl. ................. 438/233; 257/E21.507
(58) Field of Classification Search ............ 438/233, 438/523, 618, 622, 672, 682, 755; 257/384, 257/E21.165, E21.636, E21.199, E21.507
See application file for complete search history.

(56) References Cited

U.S. PATENT DOCUMENTS 6,326,270 B1 * 12/2001 Lee et al. .................. 438/279

FOREIGN PATENT DOCUMENTS

| JP | 2000-223568 | 8/2000 |
|---|---|---|
| JP | 2004-79888 | 3/2004 |
| JP | 3626058 | 12/2004 |

* cited by examiner

*Primary Examiner*—David Vu
(74) *Attorney, Agent, or Firm*—Young & Thompson

(57) ABSTRACT

A method of manufacturing a semiconductor device includes: (A) forming a gate electrode of a transistor on a substrate, a top layer of the gate electrode being a first metal film; (B) blanket depositing an interlayer insulating film; and (C) forming a first contact hole contacting the gate electrode and a second contact hole contacting a surface of the substrate. The method further includes: (D) siliciding an exposed surface of the first metal film to form a first silicide at a bottom of the first contact hole; (E) after the (D) process, blanket depositing a second metal film; and (F) after the (E) process, forming a second silicide at a bottom of the second contact hole through a silicide reaction between the second metal film and the surface of the substrate.

11 Claims, 18 Drawing Sheets

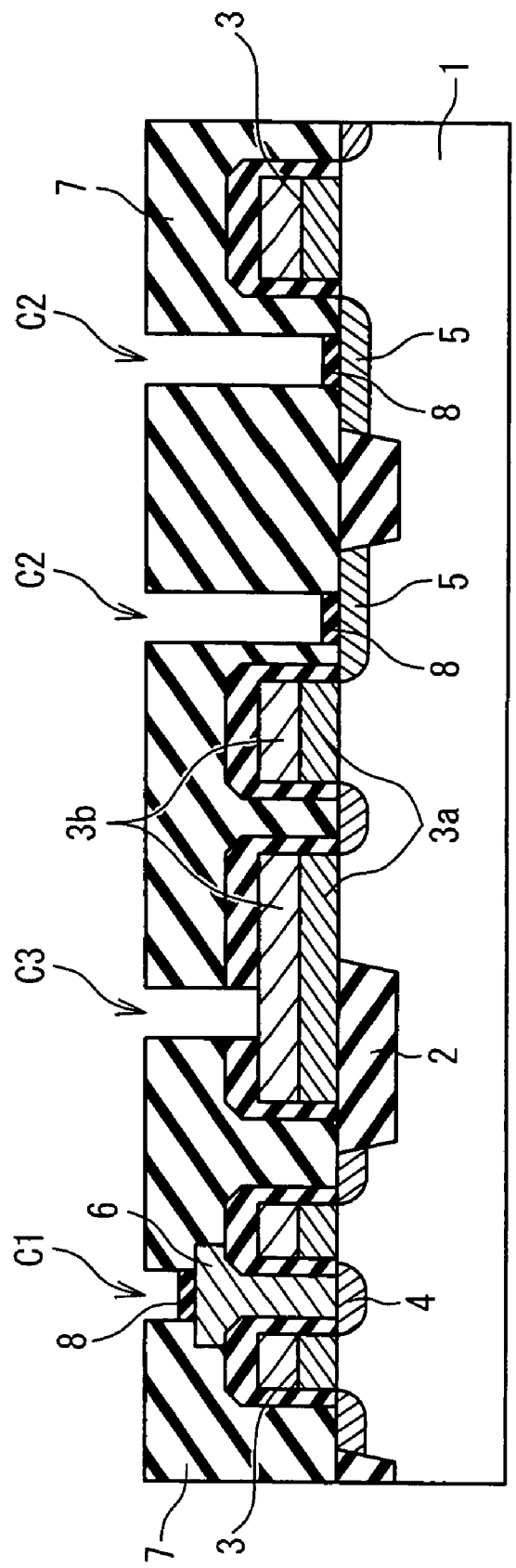

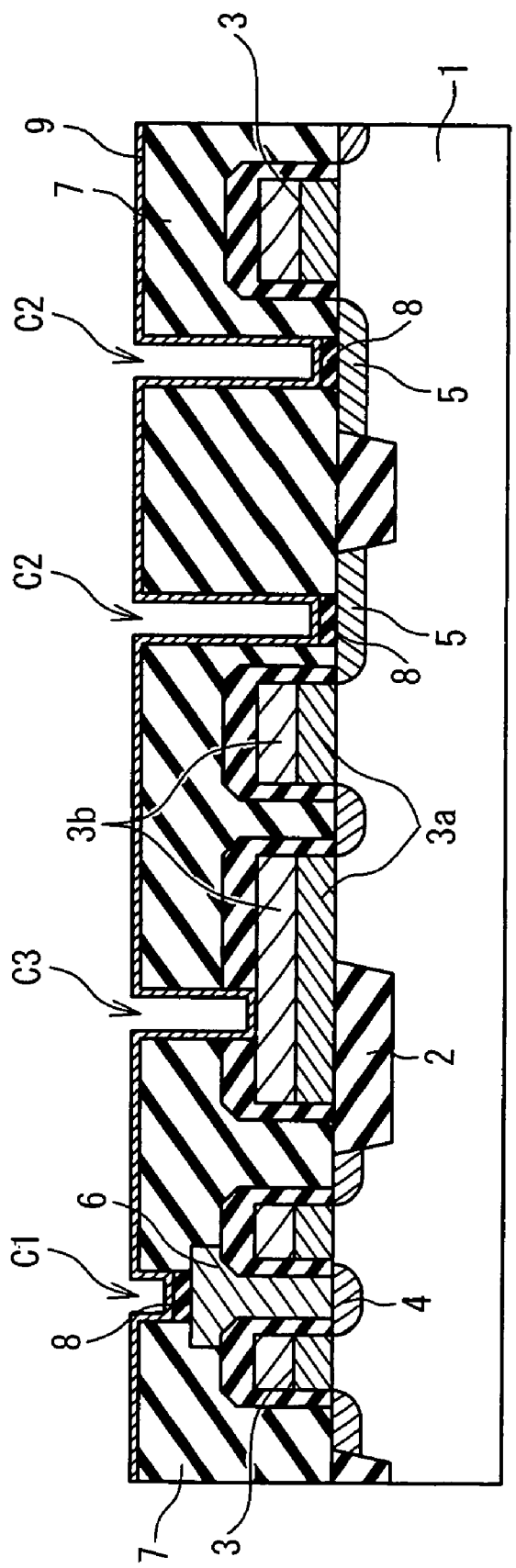

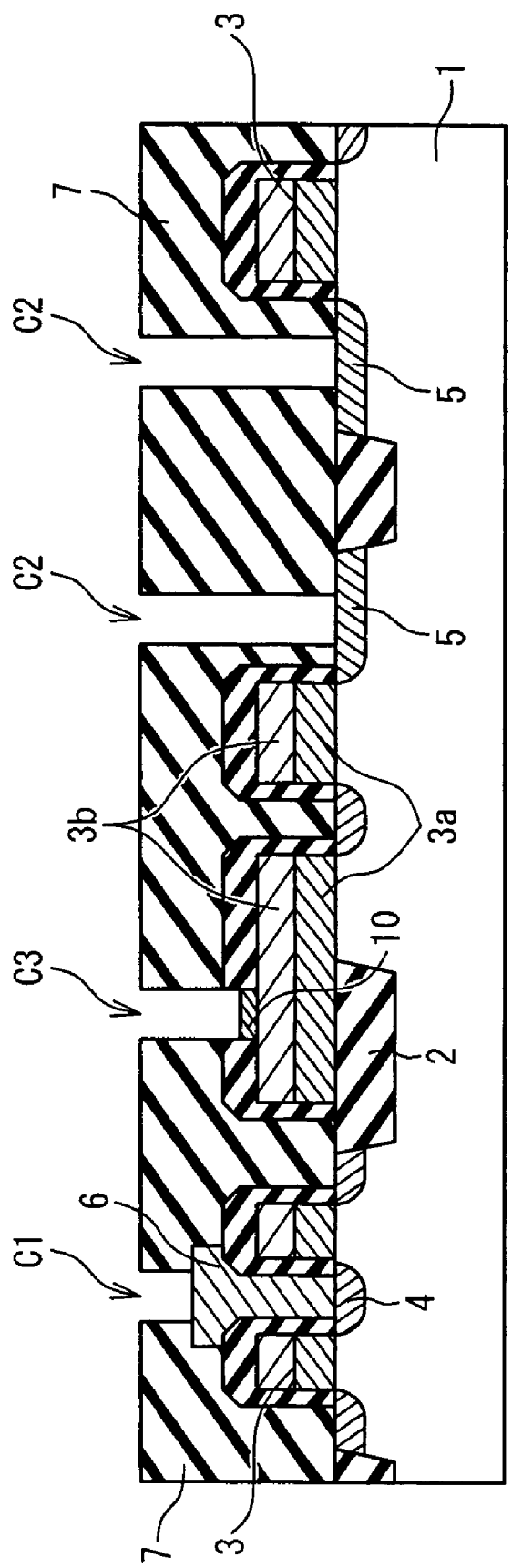

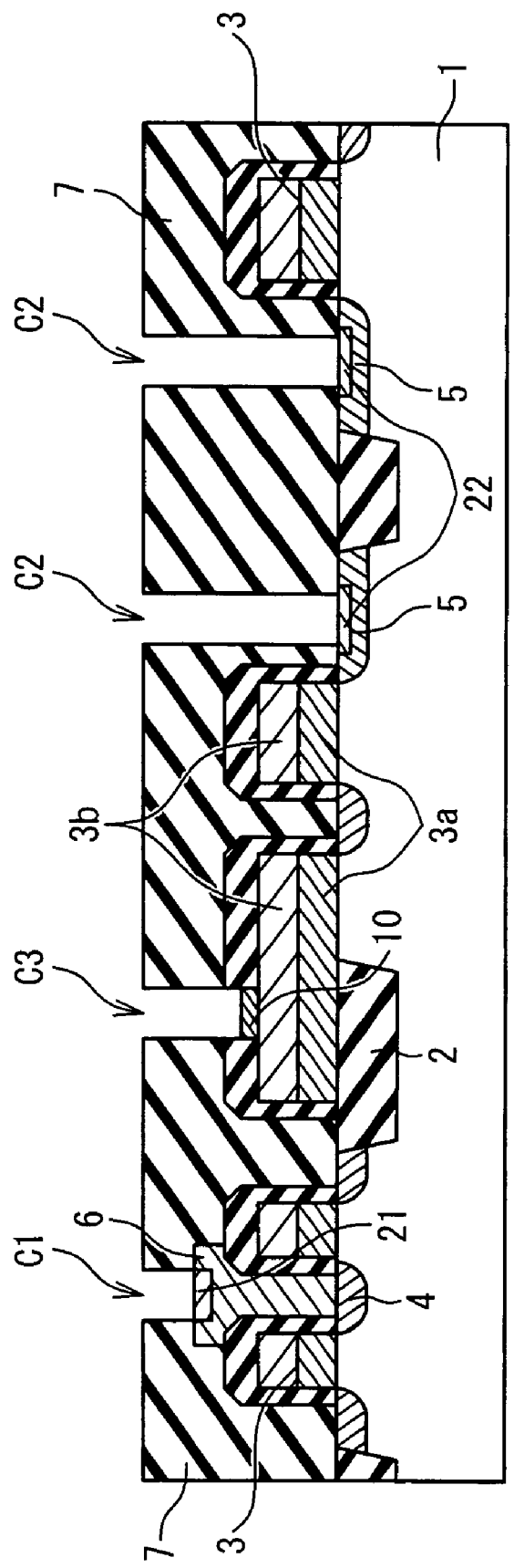

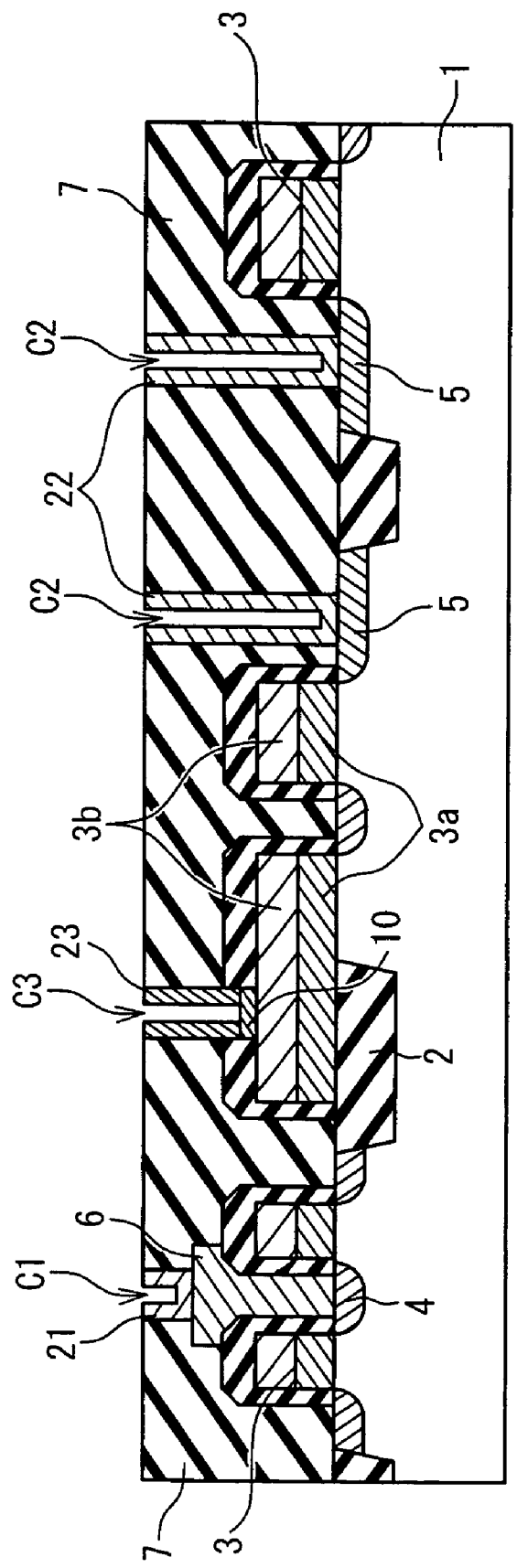

METHOD OF MANUFACTURING SEMICONDUCTOR DEVICE AND SEMICONDUCTOR MEMORY DEVICE

BACKGROUND OF THE INVENTION

1. Field of the Invention

The present invention relates to a method of manufacturing a semiconductor device and a semiconductor memory device. In particular, the present invention relates to a method of manufacturing a semiconductor device and a semiconductor memory device to which a silicide technique is applied.

2. Description of the Related Art

Silicide with low resistivity, high heat resistance and high oxidataion resistance is produced by reacting silicon and metal at high temperature. In a field of a semiconductor device such as a DRAM (Dynamic Random Access Memory) and the like, a silicide technique in which the silicide is formed at a bottom of a contact hole is often employed for the purpose of suppressing a contact resistance. Such a silicide technique is described in, for example, Japanese Laid-Open Patent Application JP-P2000-223568, Japanese Laid-Open Patent Application JP-P2004-79888, and Japanese Patent No. 3626058. With reference to FIGS. 1A to 1D, manufacturing processes of a conventional DRAM having a silicide layer will be described below.

Referring to FIG. 1A, an isolation structure 102 such as an STI (Shallow Trench Isolation) and the like is formed in a silicon substrate 101. After that, gate electrodes 103 are formed on the silicon substrate 101 through gate insulating films. The gate electrodes 103 include a gate electrode of a select transistor included in a DRAM cell and a gate electrode of a peripheral transistor included in a logic circuit. The gate electrode 103 has a lamination structure in which a gate polysilicon film 103a and a tungsten film (metal film) 103b are stacked in this order, and the gate electrode 103 thus constructed is referred to as a "poly-metal gate electrode". A process of manufacturing such a poly-metal gate electrode is referred to as a "ploy-metal gate process".

Next, diffusion layers are formed in the silicon substrate 101 by an ion implantation using the gate electrode 103 as a mask. More specifically, a source/drain diffusion layer 104 of the select transistor and a source/drain diffusion layer 105 of the peripheral transistor are formed at a surface of the silicon substrate 101. Then, a cell contact plug 106 is formed on the source/drain diffusion layer 104 of the select transistor in the DRAM cell. The cell contact plug 106 is made of doped polysilicon or doped amorphous silicon. The cell contact plug 106 is a part of a plug for connecting between the source/drain diffusion layer 104 and a capacitor of the DRAM cell.

Next, an interlayer insulating film 107 is blanket deposited so as to cover the cell contact plug 106. After that, contact holes C1 and C2 are formed by using the photolithography technique. More specifically, after a resist mask having a predetermined pattern is formed on the interlayer insulating film 107, the interlayer insulating film 107 in a predetermined region is removed by dry etching. As a result, the contact hole C1 contacting the cell contact plug 106 is formed in a region where the DRAM cell is formed. Moreover, the contact hole C2 contacting the source/drain diffusion layer 105 is formed in a region where the peripheral transistor is formed. At this time, a contact hole that contacts the gate electrode 103 is not formed, the reason of which will be explained later.

Next, the silicide technique is applied for the purpose of suppressing the contact resistance (hereinafter referred to as "contact resistance reducing process"). More specifically, as shown in FIG. 1B, a cobalt film 120 is blanket deposited by a sputtering method. Subsequently, a heat treatment is performed, and thereby silicide reactions occur between the cobalt film 120 and the silicon substrate 101 and between the cobalt film 120 and the cell contact plug 106. Then, the unreacted cobalt film 120 is removed by using mixed solution of acid and hydrogen peroxide ($H_2O_2$), and a structure shown in FIG. 1C is obtained. In FIG. 1C, cobalt silicide 121 and 122 are formed at the bottoms of the contact holes C1 and C2, respectively.

Next, as shown in FIG. 1D, a contact hole C3 contacting the gate electrode 103 is formed by using the photolithography technique. After that, the contact hole C1 on the cell contact plug 106 is filled with a contact plug connected to the capacitor of the DRAM cell. Also, the contact holes C2 and C3 are filled with contact plugs connected to upper layer interconnections, respectively.

According to the above-described conventional technique, the contact holes C1, C2 and the contact hole C3 are formed in separate processes. The reason is as follows.

If the contact holes C1 to C3 are formed in the same process, the tungsten film 103b of the poly-metal gate electrode 103 is exposed in the stage shown in FIG. 1A. After that, the cobalt silicide 121 and 122 are formed as shown in FIGS. 1B and 1C. Here, the unreacted cobalt film 120 that is not silicided is removed by using the mixed solution of acid and $H_2O_2$ (etching solution). At this time, the tungsten film 103b of the gate electrode 103 is also dissolved into the etching solution for the cobalt removal. Therefore, it is not possible to open a contact hole that reaches the poly-metal gate electrode in the stages shown in FIGS. 1B and 1C.

As described above, the contact holes C1 to C3 are not formed simultaneously according to the conventional technique. Two processes of the first photolithography process (forming the contact holes C1, C2) and the second photolithography process (forming the contact hole C3) are necessary for forming the contact holes. Therefore, the manufacturing process is complicated. Moreover, it is necessary to prepare two different masks for the respective photolithography processes. As a result, the production cost is increased.

SUMMARY OF THE INVENTION

An object of the present invention is to provide a technique that can suppress the number of photolithography processes in manufacturing a semiconductor device or a semiconductor memory device having a silicide layer.

Another object of the present invention is to simplify processes of manufacturing a semiconductor device or a semiconductor memory device having a silicide layer.

Still another object of the present invention is to reduce a production cost of a semiconductor device or a semiconductor memory device having a silicide layer.

In an aspect of the present invention, a method of manufacturing a semiconductor device is provided. The method includes: (A) forming a gate electrode of a transistor on a substrate, wherein a top layer of the gate electrode is a first metal film; (B) blanket depositing an interlayer insulating film; (C) forming a first contact hole contacting the gate electrode and a second contact hole contacting a surface of the substrate by etching the interlayer insulating film using a mask; (D) after the (C) process, siliciding an exposed surface of the first metal film to form a first silicide at a bottom of the first contact hole; (E) after the (D) process, blanket depositing a second metal film; (F) after the (E) process, forming a second silicide at a bottom of the second contact hole through a silicide reaction between the second metal film and the surface of the substrate; and (G) after the (F) process, removing the unreacted second metal film.

The above-mentioned (D) process can include: (D1) oxidizing the substrate surface to form an oxide film at the bottom of the second contact hole; (D2) blanket depositing a silicon film; (D3) forming the first silicide at the bottom of the first contact hole through a silicide reaction between the silicon film and the first metal film; (D4) removing the unreacted silicon film; and (D5) removing the oxide film at the bottom of the second contact hole.

Alternatively, the above-mentioned (D) process may include: (D1) blanket depositing a silicon film without through the oxidation process; (D2) forming the first silicide at the bottom of the first contact hole through a silicide reaction between the silicon film and the first metal film; and (D3) removing the silicon film at a surface by CMP (Chemical Mechanical Polishing).

According to the present invention, the first contact hole contacting the poly-metal gate electrode and the second contact hole contacting the substrate surface are formed simultaneously in the above-mentioned (C) process. After that, in the (D) process, only the exposed surface of the poly-metal gate electrode is selectively silicided, and thereby the first silicide is formed. The formed first silicide plays a role of preventing the first metal film of the poly-metal gate electrode from dissolving during the above-mentioned (G) process. For example, the first metal film is a tungsten film, and the first silicide is tungsten silicide. In the (G) process, the unreacted second metal film that is not silicided is removed, for example, by using etching solution including $H_2O_2$. The etching solution is capable of dissolving the tungsten film, while is not capable of dissolving the tungsten silicide. Therefore, the poly-metal gate electrode is not dissolved into the etching solution in the (G) process.

In this manner, the first metal film of the poly-metal gate electrode is not eroded, because the first silicide is so formed as to cover the first metal film. In other words, since the first metal film of the poly-metal gate electrode is prevented from erosion and removal, it becomes possible to form the first contact hole and the second contact hole simultaneously in the above-mentioned (C) process. As a result, the number of photolithography processes required for providing the contact holes can be suppressed. Therefore, the manufacturing process can be simplified. Moreover, the production cost can be reduced.

In another aspect of the present invention, a method of manufacturing a semiconductor memory device is provided. The method includes: (a) forming a select transistor of a memory cell on a substrate, wherein a top layer of a gate electrode of the select transistor is a first metal film; (b) forming a contact plug on a diffusion layer of the select transistor; (c) blanket depositing an interlayer insulating film; (d) forming a first contact hole contacting the gate electrode and a second contact hole contacting the contact plug by etching the interlayer insulating film using a mask; (e) after the (d) process, siliciding an exposed surface of the first metal film to form a first silicide at a bottom of the first contact hole; (f) after the (e) process, blanket depositing a second metal film; (g) after the (f) process, forming a second silicide at a bottom of the second contact hole through a silicide reaction between the second metal film and a surface of the contact plug; and (h) after the (g) process, removing the unreacted second metal film.

The above-mentioned (e) process can include: (e1) oxidizing the surface of the contact plug to form an oxide film at the bottom of the second contact hole; (e2) blanket depositing a silicon film; (e3) forming the first silicide at the bottom of the first contact hole through a silicide reaction between the silicon film and the first metal film; (e4) removing the unreacted silicon film; and (e5) removing the oxide film at the bottom of the second contact hole.

Alternatively, the above-mentioned (e) process may include: (e1) blanket depositing a silicon film without through the oxidation process; (e2) forming the first silicide at the bottom of the first contact hole through a silicide reaction between the silicon film and the first metal film; and (e3) removing the silicon film at a surface by CMP (Chemical Mechanical Polishing).

According to the present invention, the first metal film of the poly-metal gate electrode is not eroded, because the first silicide is so formed as to cover the first metal film. In other words, since the first metal film of the poly-metal gate electrode is prevented from erosion and removal, it becomes possible to form the first contact hole and the second contact hole simultaneously in the above-mentioned (d) process. As a result, the number of photolithography processes required for providing the contact holes can be suppressed. Therefore, the manufacturing process can be simplified. Moreover, the production cost can be reduced.

After the (h) process, the second contact hole is filled with a plug connecting between the second silicide and a capacitor of the memory cell. Thus, a DRAM is manufactured.

According to the present invention, it is possible to suppress the number of photolithography processes in manufacturing a semiconductor device or a semiconductor memory device having a silicide layer. Thus, the manufacturing process is simplified and the production cost is reduced.

BRIEF DESCRIPTION OF THE DRAWINGS

The above and other objects, advantages and features of the present invention will be more apparent from the following description taken in conjunction with the accompanying drawings, in which:

FIGS. 2A to 2I are cross-sectional views illustrating processes of manufacturing a semiconductor memory device according to a first embodiment of the present invention; and FIGS. 3A to 3E are cross-sectional views illustrating processes of manufacturing a semiconductor memory device according to a second embodiment of the present invention.

DESCRIPTION OF THE PREFERRED EMBODIMENTS

A method of manufacturing a semiconductor device and a semiconductor memory device according to the present invention will be described below with reference to the attached drawings. The semiconductor memory device is exemplified by a DRAM (Dynamic Random Access Memory) having a memory cell (DRAM cell) including a capacitor. The silicide technique is applied to the present invention. Described below is an example where CoSi (Cobalt silicide) is formed as silicide for reducing the contact resistance. It should be noted that the silicide formed is not limited to CoSi. Other silicide such as NiSi (nickel silicide) and the like can be used.

First Embodiment

With reference to FIGS. 2A to 2I, manufacturing processes of a semiconductor device according to a first embodiment of the present invention will be described below.

Figure 1A:
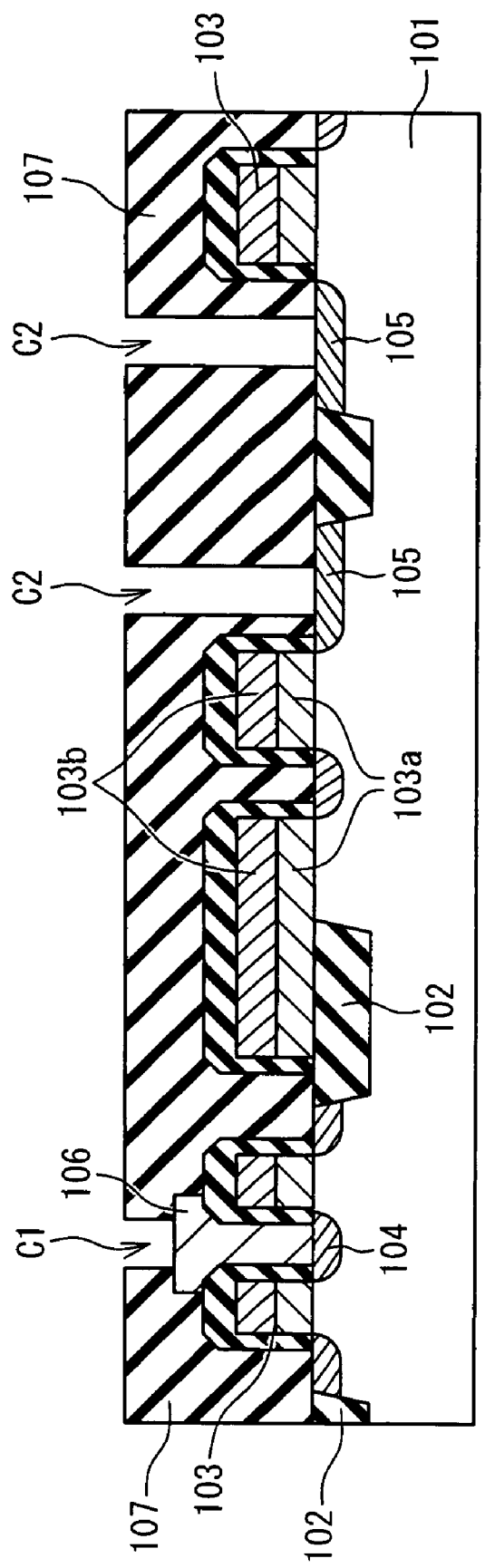
FIGS. 1A to 1D are cross-sectional views illustrating processes of manufacturing a semiconductor device according to a conventional technique.
Figure 1B:
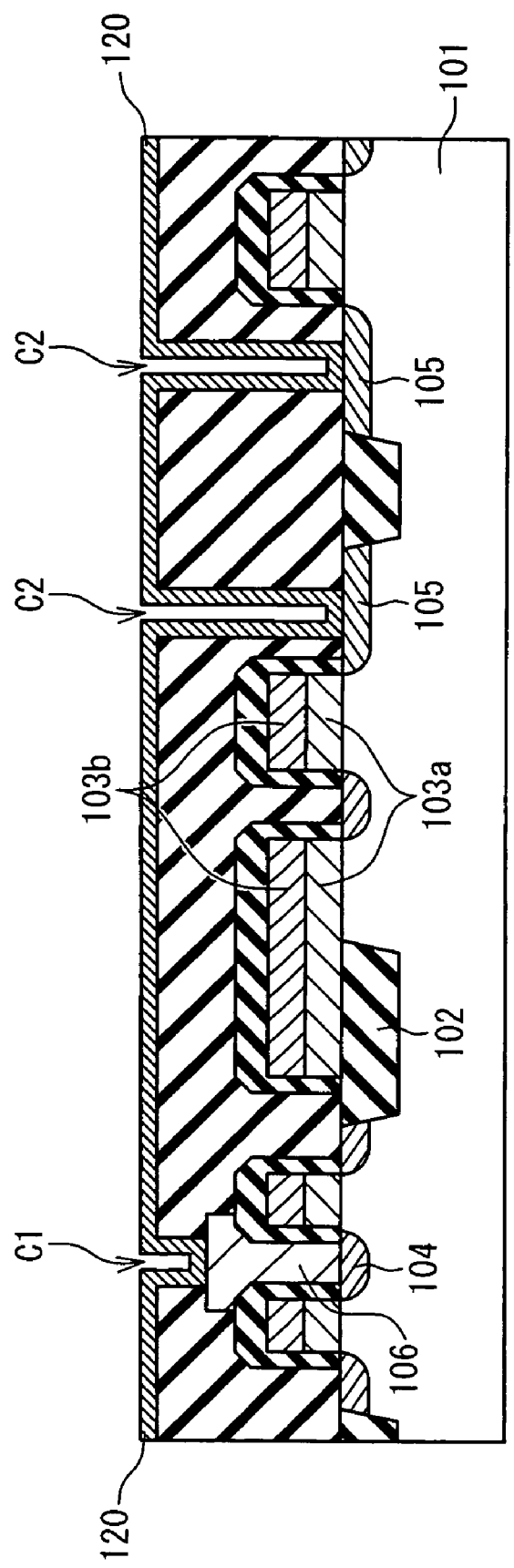
Figure 1C:
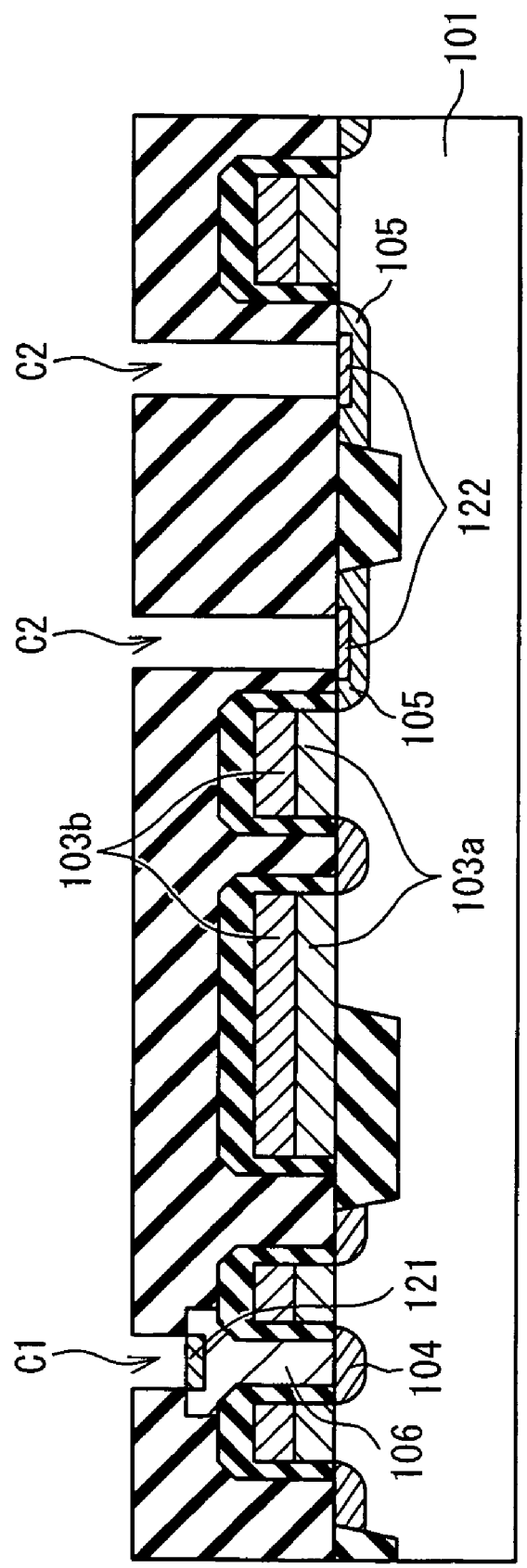
Figure 1D:
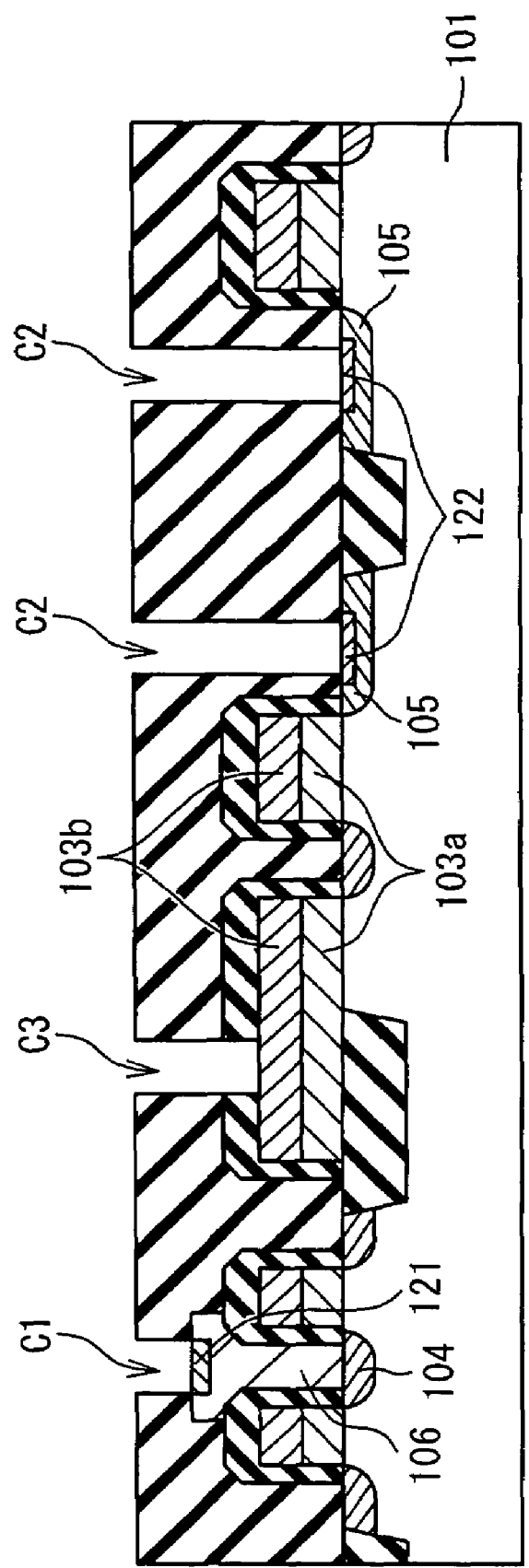
Figure 2A:
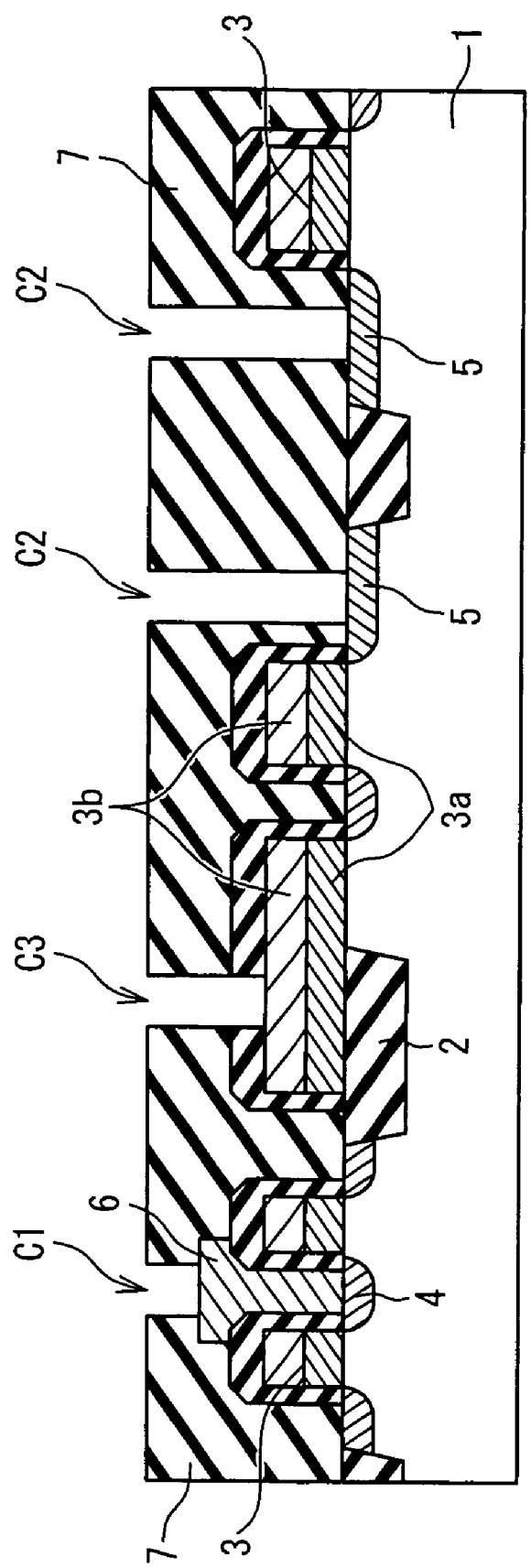

Referring to FIG. 2A, an isolation structure 2 such as an STI and the like is formed in a silicon substrate 1. After that, gate electrodes 3 are formed on the silicon substrate 1 through gate insulating films. The gate electrodes 3 include a gate electrode of a select transistor included in the DRAM cell and a gate electrode of a peripheral transistor included in a logic circuit. The gate electrode 3 is a poly-metal gate electrode, and has a lamination structure in which a gate polysilicon film 3a and a metal film 3b are stacked in this order. That is, the metal film 3b is formed on the gate polysilicon film 3a, and the top layer of the gate electrode 3 is the metal film 3b. The metal film 3b is exemplified by a tungsten (W) film. A process of manufacturing such a poly-metal gate electrode is referred to as a "ploy-metal gate process".

Next, diffusion layers are formed in the silicon substrate 1 by an ion implantation using the gate electrode 3 as a mask. More specifically, a source/drain diffusion layer 4 of the select transistor and a source/drain diffusion layer 5 of the peripheral transistor are formed at a surface of the silicon substrate 1. In this manner, the select transistor of the DRAM cell and the peripheral transistor included in the logic circuit are formed on the silicon substrate 1. Further, a cell contact plug 6 is formed on the source/drain diffusion layer 4 of the select transistor by a well-known method. The cell contact plug 6 is made of doped polysilicon or doped amorphous silicon. The cell contact plug 6 is a part of a plug for connecting between the source/drain diffusion layer 4 and a capacitor of the DRAM cell.

Next, an interlayer insulating film 7 is blanket deposited so as to cover the cell contact plug 6. After that, contact holes C1 to C3 are formed simultaneously by using the photolithography technique. More specifically, after a resist mask having a predetermined pattern is formed on the interlayer insulating film 7, the interlayer insulating film 7 in a predetermined region is removed by dry etching. As a result, the contact hole C1 contacting the cell contact plug 6 is formed in a region where the DRAM cell is formed. Moreover, the contact hole C2 contacting the silicon substrate 1 (source/drain diffusion layer 5) is formed in a region where the peripheral transistor is formed. Furthermore, the contact hole C3 contacting the gate electrode 3 is formed in a region where the gate electrode 3 is formed. Thus, a surface of the gate electrode 3, namely, the tungsten film 3b is exposed at the bottom of the contact hole C3.

Next, a "contact resistance reducing process" is performed by using the silicide technique for the purpose of suppressing the contact resistance.

According to the present embodiment, the exposed silicon surface is first oxidized by the selective oxidation method. Consequently, as shown in FIG. 2B, an oxide film 8 is formed at the bottom of the contact hole C1 so as to cover the cell contact plug 6. Also, an oxide film 8 is formed at the bottom of the contact hole C2 so as to cover the silicon substrate 1 (source/drain diffusion layer 5). The oxide film 8 serves as a stopper during an after-mentioned process when an etching is performed by the use of ammonia. An example of conditions of the selective oxidation is as follows: atmosphere $[H_2O]/[H_2+H_2O]$=20%; pressure=200 torr; temperature=850 to 900 degrees centigrade; and processing time=30 to 60 minutes. As a result, the oxide film 8 of about 5 nm thickness is formed over the silicon surface.

Next, as shown in FIG. 2C, a silicon film 9 (for example, polysilicon) is blanket deposited. Consequently, the silicon film 9 is formed on the oxide film 8 in the contact holes C1 and C2. In the contact hole C3, the silicon film 9 is formed immediately above the tungsten film 3b. An example of conditions of the film deposition is as follows: temperature=530 degrees centigrade; pressure=0.8 torr; material-flow rate=$SiH_4$–2 slm; and processing time=6 to 7 minutes. As a result, the silicon film 9 of about 10 nm thickness is deposited.

Figure 2D:
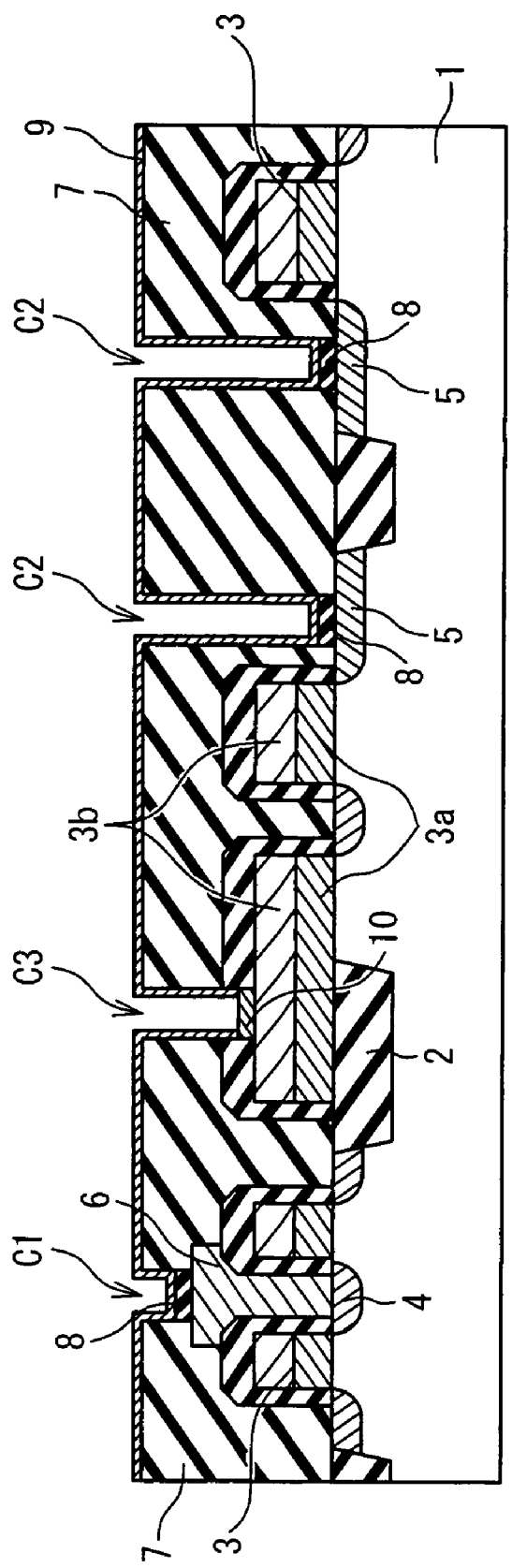

Next, a heat treatment is performed (800 to 1200 degrees centigrade, 10 to 30 seconds). Due to the heat treatment, a silicide reaction occurs between the silicon film 9 and the tungsten film 3b at the bottom of the contact hole C3. Consequently, as shown in FIG. 2D, a tungsten silicide 10 (first silicide) is formed at the bottom of the contact hole C3. The tungsten silicide 10 is so formed as to cover the tungsten film 3b, and prevents the tungsten film 3b from being eroded by solution during an after-mentioned cobalt removal process. Thereby, a structure that can prevent loss of gate interconnection material is obtained.

Figure 2E:
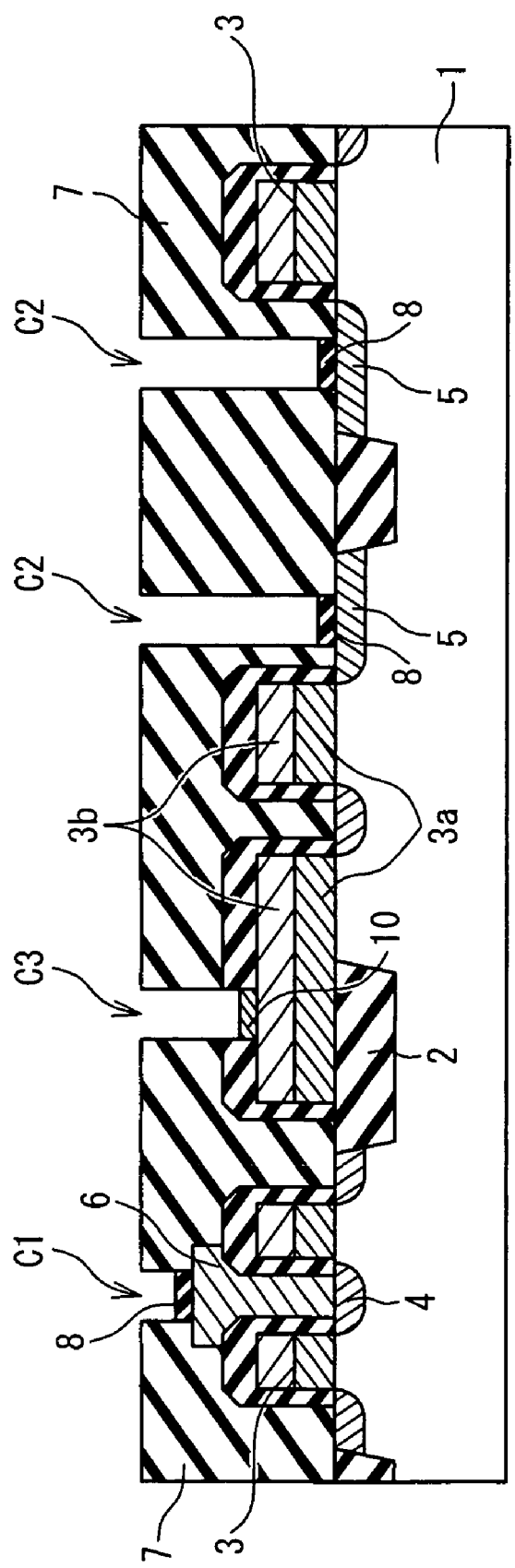

Next, the unreacted silicon film 9 is removed by wet etching. More specifically, the wet etching is performed for about 1 to 3 minutes by using heated ammonia. Here, the above-mentioned oxide film 8 serves as an etching stopper. Consequently, as shown in FIG. 2E, the oxide film 8 remains at the bottoms of the contact holes C1, C2, and the tungsten silicide 10 remains at the bottom of the contact hole C3.

Next, the oxide film 8 at the bottoms of the contact holes C1, C2 is removed by a hydrofluoric acid treatment (LAL30: about 5 minutes). As a result, as shown in FIG. 2F, electric continuity is secured in the contact holes C1 and C2. On the other hand, the tungsten silicide 10 still remains at the bottom of the contact hole C3.

As described above, the exposed surface of the tungsten film 3b is selectively silicided, and thus the tungsten silicide 10 is formed at the bottom of the contact hole C3.

Figure 2G:
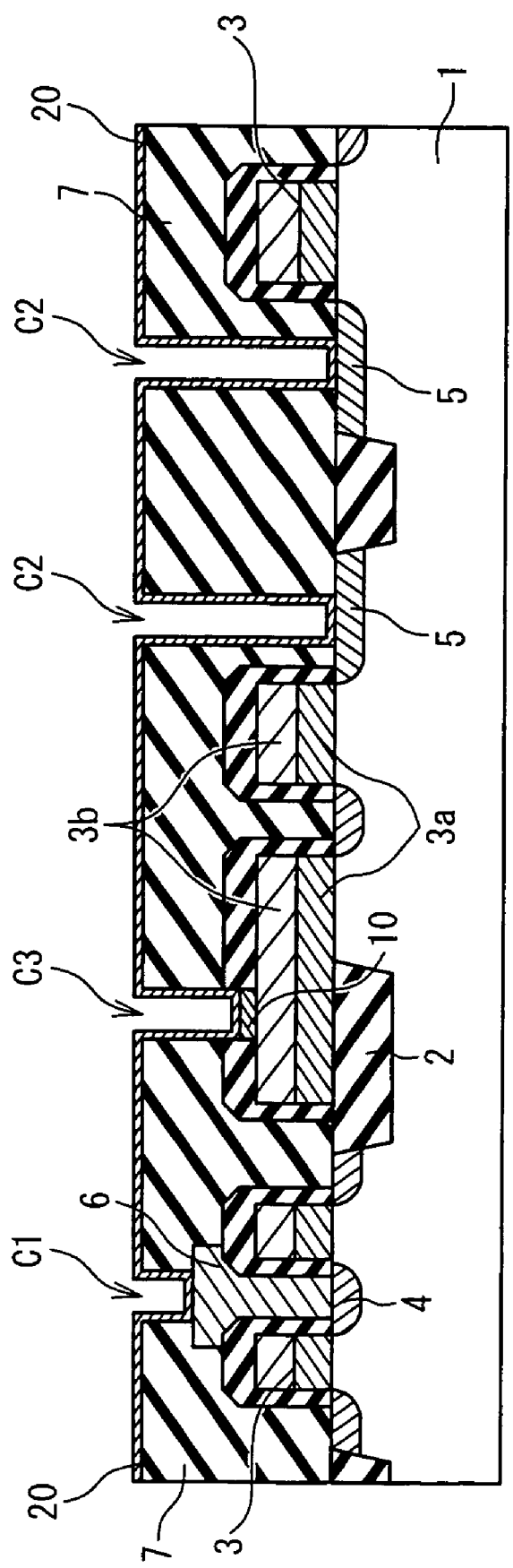
Figure 21:
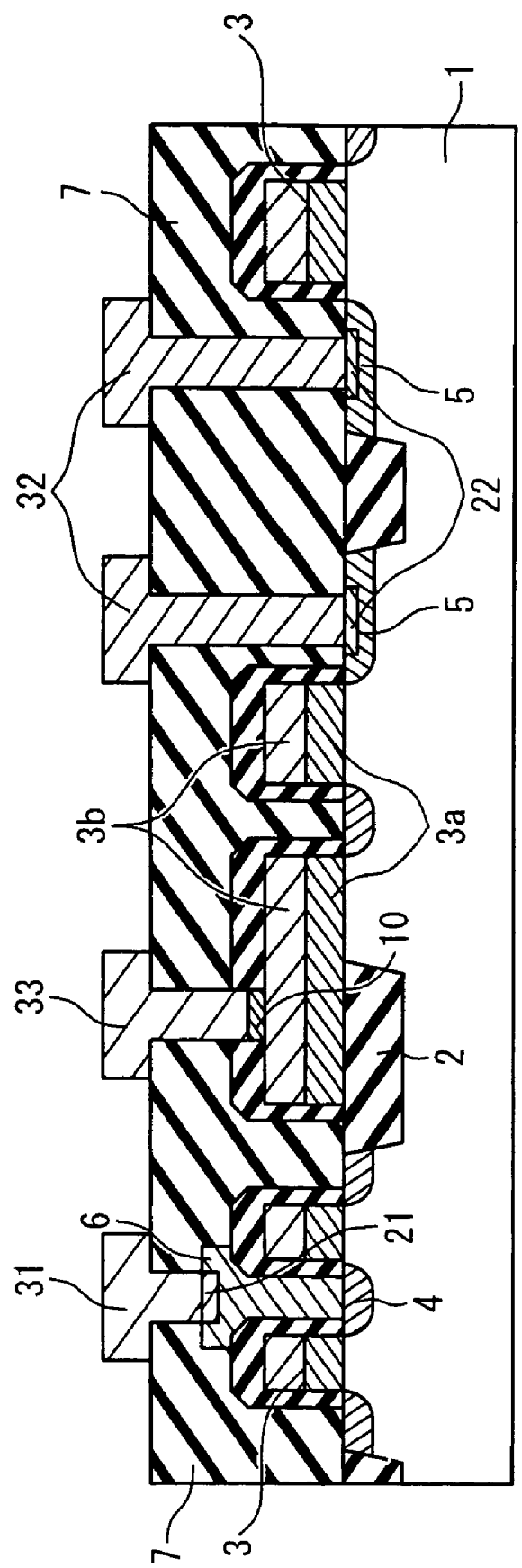

After that, as shown in FIG. 2G, a cobalt film 20 that is a material of cobalt silicide is blanket deposited by a sputtering method. In the contact hole C1, the cobalt film 20 is formed on the cell contact plug 6. In the contact hole C2, the cobalt film 20 is formed on the silicon substrate 1. In the contact hole C3, the cobalt film 20 is formed on the tungsten silicide 10. The thickness of the cobalt film 20 is about 50 nm.

Next, a heat treatment (about 710 degrees centigrade, 30 sec) is performed. As a result, a silicide reaction occurs between the cobalt film 20 and the surface of the cell contact plug 6 at the bottom of the contact hole C1. Also, a silicide reaction occurs between the cobalt film 20 and the surface of the silicon substrate 1 at the bottom of the contact hole C2.

Further, the unreacted cobalt film 20 that is not silicided is etched for about 3 minutes by using mixed solution of acid and hydrogen peroxide ($H_2O_2$) such as SPM (Sulfuric Peroxide Mixture). As a result, a structure shown in FIG. 2H is obtained. In FIG. 2H, cobalt silicide 21 and 22 (second silicide) are formed at the bottoms of the contact holes C1 and C2, respectively. At this time, the tungsten film 3b of the gate electrode 3 is covered by the tungsten silicide 10 at the bottom of the contact hole C3. Therefore, the tungsten film 3b is not eroded by the etching solution in the process of removing the cobalt film 20. In other words, the loss of the gate interconnection material is prevented.

After that, as shown in FIG. 2I, the contact hole C1 on the cell contact plug 6 is filled with a contact plug 31 connected to the cobalt silicide 21. The contact plug 31 and the cell contact plug 6 serves as a contact that connects between the source/drain diffusion layer 4 of the select transistor and the capacitor of the DRAM cell. Also, the contact hole C2 in the peripheral transistor region is filled with a contact plug 32 connected to the cobalt silicide 22. The contact plug 32 serves as a contact that connects between the source/drain diffusion layer 5 of the peripheral transistor and an upper layer interconnection. Also, the contact hole C3 is filled with a contact plug 33 connected to the tungsten silicide 10. The contact plug 33 serves as a contact that connects between the gate electrode 3 and a word line. Subsequently, the capacitor of the DRAM cell is formed to be connected to the contact plug 31. Moreover, word lines, bit lines and upper layer interconnections having a predetermined pattern are formed. Thus, a DRAM is manufactured.

According to the present embodiment, as described above, the tungsten silicide 10 is so formed as to cover the tungsten film 3b prior to the process of removing the cobalt film 20. Therefore, the poly-metal gate electrode 3 is not eroded. In other words, since the poly-metal gate electrode 3 is prevented from erosion and removal, it becomes possible to form the contact holes C1 to C3 simultaneously. As a result, the number of photolithography processes required for providing the contact holes C1 to C3 can be suppressed. Therefore, the manufacturing process can be simplified. Moreover, the production cost can be reduced.

Second Embodiment

With reference to FIGS. 3A to 3E, manufacturing processes of a semiconductor device according to a second embodiment of the present invention will be described below. In the present embodiment, processes after the structure shown in FIG. 2A is obtained are different from those in the first embodiment. The same reference numerals are given to the same components as those described in the first embodiment, and an overlapping description will be appropriately omitted.

Figure 3A:
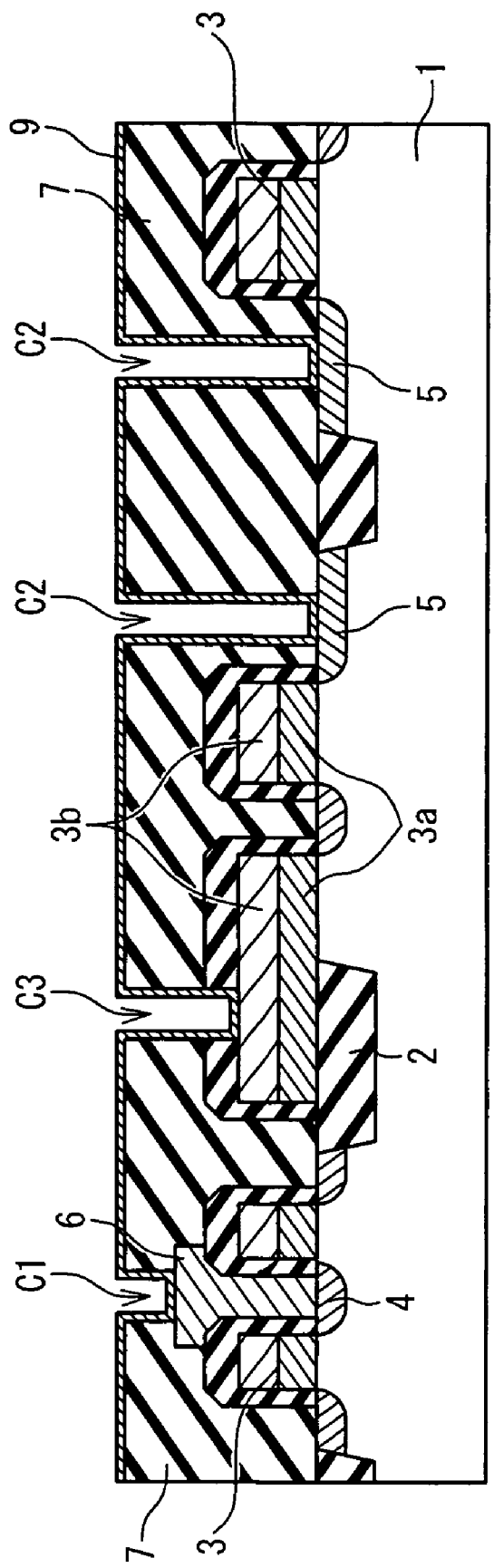

After the structure shown in FIG. 2A is obtained, a silicon film 9 (for example, polysilicon) is blanket deposited, as shown in FIG. 3A. Here, the above-mentioned oxide film 8 is not formed, which is different from the first embodiment. In the contact hole C1, the silicon film 9 is formed on the cell contact plug 6. In the contact hole C2, the silicon film 9 is formed on the silicon substrate 1 (source/drain diffusion layer 5). In the contact hole C3, the silicon film 9 is formed immediately above the tungsten film 3b. Since the oxide film 8 is not formed, electric continuity is secured in the contact holes C1 and C2.

Figure 3B:
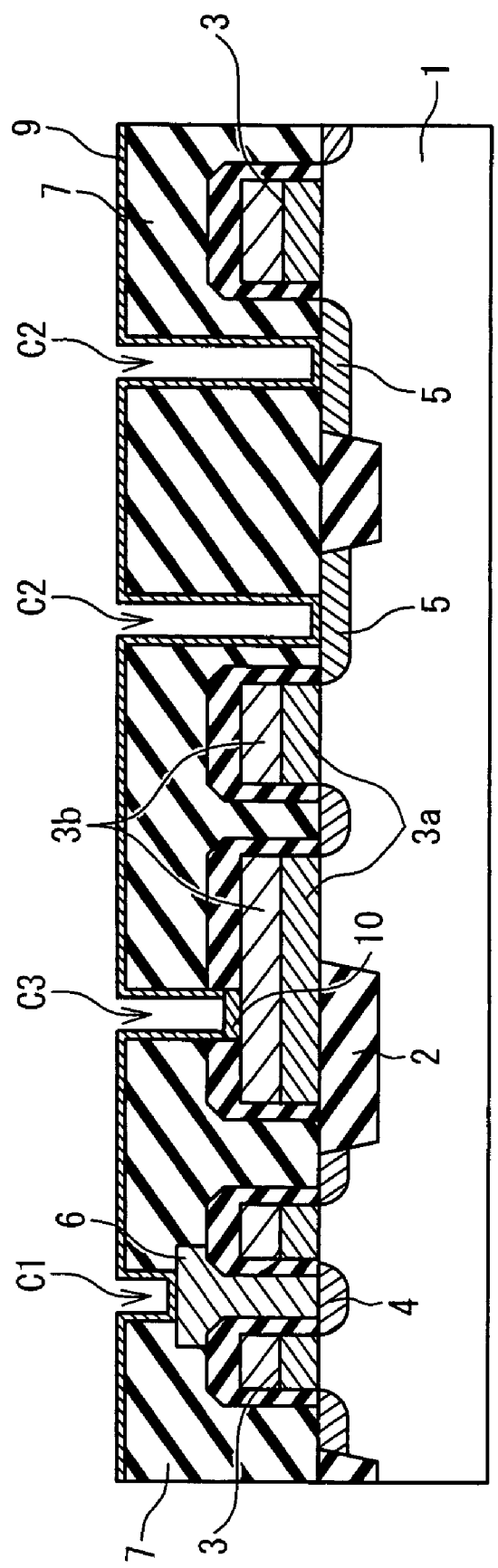

Next, a heat treatment is performed. Due to the heat treatment, a silicide reaction occurs between the silicon film 9 and the tungsten film 3b at the bottom of the contact hole C3. Consequently, as shown in FIG. 3B, a tungsten silicide 10 (first silicide) is formed at the bottom of the contact hole C3. The tungsten silicide 10 is so formed as to cover the tungsten film 3b, and prevents the tungsten film 3b from being eroded by solution during an after-mentioned cobalt removal process.

Figure 3C:
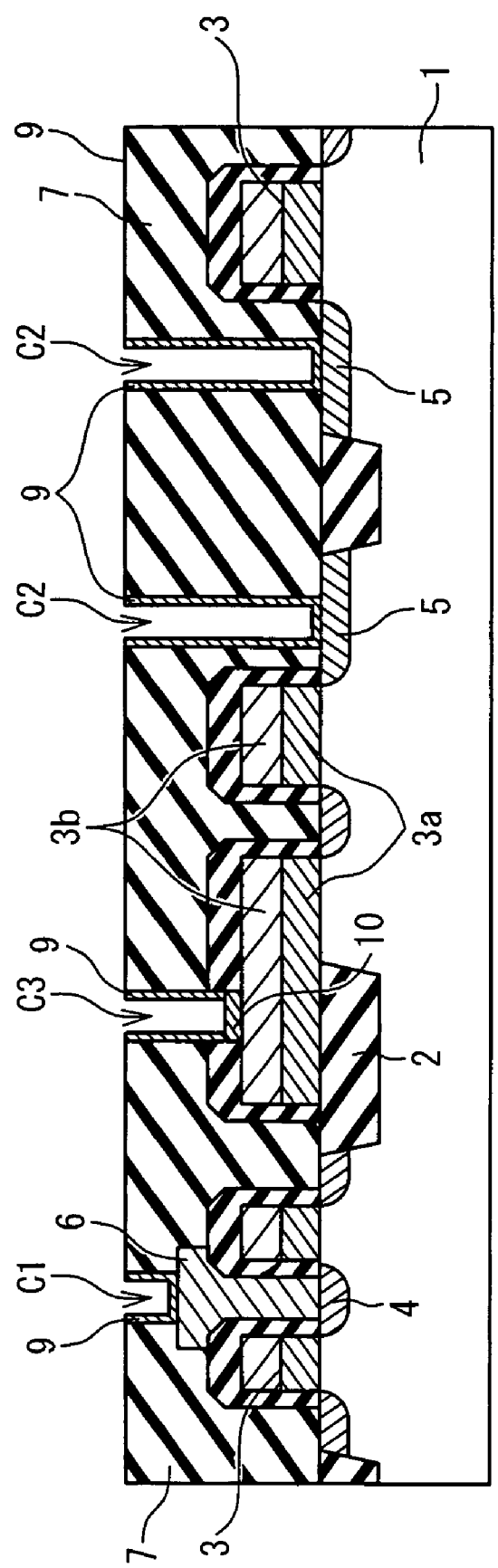

Next, a CMP (Chemical Mechanical Polishing) is performed. Consequently, as shown in FIG. 3C, the silicon film 9 on the surface portion is removed and the interlayer insulating film 7 is exposed at the surface. It should be noted that the silicon film 9 remains on the side surfaces of the contact holes C1 to C3. Moreover, the silicon film 9 at the bottom of the contact hole C1 becomes a new surface of the cell contact plug 6, and the silicon film 9 at the bottom of the contact hole C2 becomes a new surface of the silicon substrate 1.

Figure 3D:
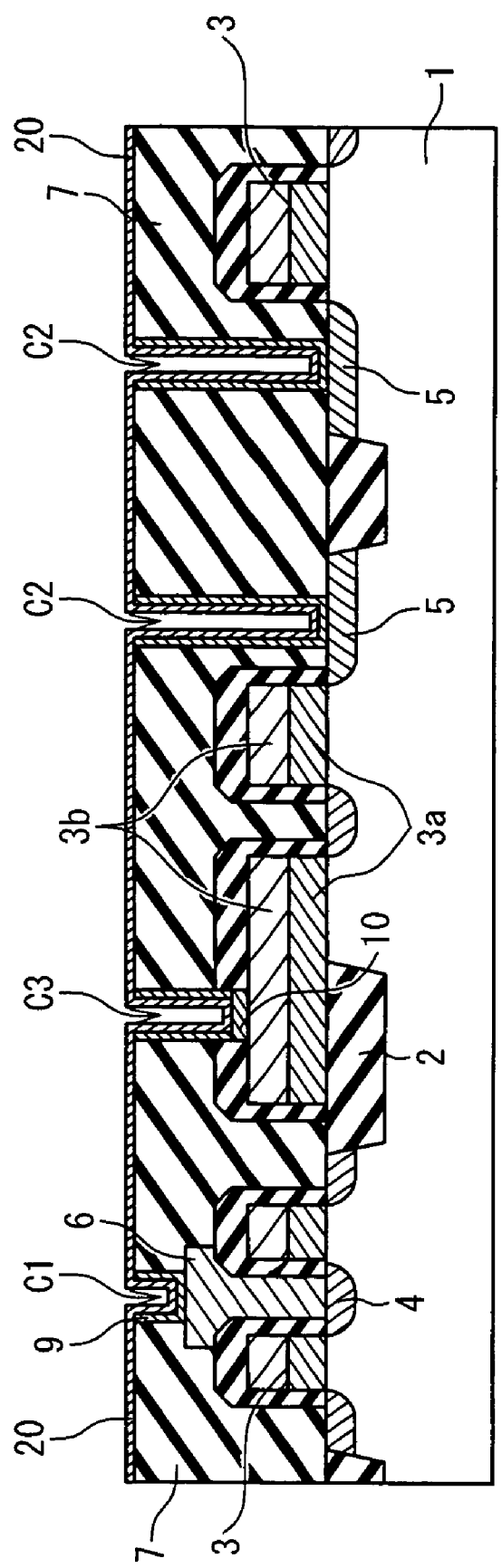

Next, as shown in FIG. 3D, a cobalt film 20 that is a material of cobalt silicide is blanket deposited by a sputtering method. Subsequently, a heat treatment is performed. As a result, a silicide reaction occurs between the cobalt film 20 and the surface of the cell contact plug 6 (the silicon film 9) at the bottom of the contact hole C1. Also, a silicide reaction occurs between the cobalt film 20 and the surface of the silicon substrate 1 (the silicon film 9) at the bottom of the contact hole C2.

Further, the unreacted cobalt film 20 that is not silicided is etched by using mixed solution of acid and $H_2O_2$ such as SPM (Sulfuric Peroxide Mixture). As a result, a structure shown in FIG. 3E is obtained. In FIG. 3E, cobalt silicide 21 and 22 (second silicide) are formed at least at the bottoms of the contact holes C1 and C2, respectively. Moreover, cobalt silicide 23 is formed on the side surface of the contact hole C3. At this time, the tungsten film 3b of the gate electrode 3 is covered by the above-mentioned tungsten silicide 10 at the bottom of the contact hole C3. Therefore, the tungsten film 3b is not eroded by the etching solution in the process of removing the cobalt film 20. In other words, the loss of the gate interconnection material is prevented.

After that, similarly to FIG. 2I, the contact holes C1 to C3 are filled with the contact plugs 31 to 33, respectively. Subsequently, the capacitor of the DRAM cell is formed to be connected to the contact plug 31. Moreover, word lines, bit lines and upper layer interconnections having a predetermined pattern are formed. Thus, a DRAM is manufactured.

According to present embodiment, the same effects as in the first embodiment can be obtained. That is to say, the number of photolithography processes required for providing the contact holes C1 to C3 can be suppressed. Therefore, the manufacturing process can be simplified. Moreover, the production cost can be reduced. Furthermore, since the formation and removal of the oxide film 8 are not necessary, the manufacturing process can be further simplified, which is an additional effect as compared with the first embodiment.

It will be obvious to one skilled in the art that the present invention may be practiced in other embodiments that depart from the above-described specific details. The scope of the present invention, therefore, should be determined by the following claims.

What is claimed is:

1. A method of manufacturing a semiconductor device comprising:
   (A) forming a gate electrode of a transistor on a substrate, wherein a top layer of said gate electrode is a first metal film;
   (B) blanket depositing an interlayer insulating film;
   (C) forming a first contact hole contacting said gate electrode and a second contact hole contacting a surface of said substrate by etching said interlayer insulating film using a mask;
   (D) after said (C) process, siliciding an exposed surface of said first metal film to form a first silicide at a bottom of said first contact hole;
   (E) after said (D) process, blanket depositing a second metal film;
   (F) after said (E) process, forming a second silicide at a bottom of said second contact hole through a silicide reaction between said second metal film and said surface of said substrate; and
   (G) after said (F) process, removing said second metal film that is unreacted.

2. The method according to claim 1, wherein said (D) process includes:
   (D1) after said (C) process, oxidizing said surface of said substrate to form an oxide film at a bottom of said second contact hole;

(D2) after said (D1) process, blanket depositing a silicon film; and (D3) after said (D2) process, forming said first silicide at a bottom of said first contact hole through a silicide reaction between said silicon film and said first metal film.

3. The method according to claim 2, wherein said (D) process further includes:

(D4) removing said silicon film that is unreacted; and (D5) removing said oxide film at a bottom of said second contact hole.

4. The method according to claim 1, wherein said (D) process includes:

(D1) after said (C) process, blanket depositing a silicon film;

(D2) after said (D1) process, forming said first silicide at a bottom of said first contact hole through a silicide reaction between said silicon film and said first metal film; and (D3) after said (D2) process, removing said silicon film at a surface by CMP (Chemical Mechanical Polishing).

5. The method according to claim 1, wherein said first metal film is a tungsten film, and said unreacted second metal film is removed by using solution including $H_2O_2$ in said (G) process.

6. A method of manufacturing a semiconductor memory device comprising:

(a) forming a select transistor of a memory cell on a substrate, wherein a top layer of a gate electrode of said select transistor is a first metal film;

(b) forming a contact plug on a diffusion layer of said select transistor;

(c) blanket depositing an interlayer insulating film;

(d) forming a first contact hole contacting said gate electrode and a second contact hole contacting said contact plug by etching said interlayer insulating film using a mask;

(e) after said (d) process, siliciding an exposed surface of said first metal film to form a first silicide at a bottom of said first contact hole;

(f) after said (e) process, blanket depositing a second metal film;

(g) after said (f) process, forming a second silicide at a bottom of said second contact hole through a silicide reaction between said second metal film and a surface of said contact plug; and (h) after said (g) process, removing said second metal film that is unreacted.

7. The method according to claim 6, wherein said (e) process includes:

(e1) after said (d) process, oxidizing said surface of said contact plug to form an oxide film at a bottom of said second contact hole;

(e2) after said (e1) process, blanket depositing a silicon film; and (e3) after said (e2) process, forming said first silicide at a bottom of said first contact hole through a silicide reaction between said silicon film and said first metal film.

8. The method according to claim 7, wherein said (e) process further includes:

(e4) removing said silicon film that is unreacted; and (e5) removing said oxide film at a bottom of said second contact hole.

9. The method according to claim 6, wherein said (e) process includes:

(e1) after said (d) process, blanket depositing a silicon film;

(e2) after said (e1) process, forming said first silicide at a bottom of said first contact hole through a silicide reaction between said silicon film and said first metal film; and (e3) after said (e2) process, removing said silicon film at a surface by CMP (Chemical Mechanical Polishing).

10. The method according to claim 6, further comprising:

(i) filling said second contact hole with a plug connecting between said second silicide and a capacitor of said memory cell.

11. The method according to claim 6, wherein said first metal film is a tungsten film, and said unreacted second metal film is removed by using solution including $H_2O_2$ in said (h) process.

* * * * *